(12) United States Patent
Narendra et al.

(10) Patent No.: US 7,698,576 B2
(45) Date of Patent: Apr. 13, 2010

(54) CPU POWER DELIVERY SYSTEM

(75) Inventors: Siva G. Narendra, Portland, OR (US); Howard A. Wilson, Beaverton, OR (US); Donald S. Gardner, Mountain View, CA (US); Peter Hazucha, Beaverton, OR (US); Gerhard Schrom, Hillsboro, OR (US); Tanay Karnik, Portland, OR (US); Nitin Borkar, Portland, OR (US); Vivek K. De, Beaverton, OR (US); Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 10/955,746

(22) Filed: Sep. 30, 2004

(65) Prior Publication Data
US 2006/0099734 A1 May 11, 2006

(51) Int. Cl.
*G06F 1/26* (2006.01)
(52) U.S. Cl. .................. 713/300; 713/340
(58) Field of Classification Search ............ 713/300, 713/340
See application file for complete search history.

(56) References Cited

U.S. PATENT DOCUMENTS

| | | | |
|---|---|---|---|
| 5,410,467 A | 4/1995 | Smith et al. | |
| 6,335,565 B1 | 1/2002 | Miyamoto et al. | |
| 6,365,962 B1 * | 4/2002 | Liang et al. | 257/668 |
| 6,469,895 B1 | 10/2002 | Smith et al. | |
| 6,791,846 B2 | 9/2004 | Smith et al. | |
| 7,247,930 B2 | 7/2007 | Narendra et al. | |
| 2002/0087906 A1 | 7/2002 | Mar et al. | |
| 2003/0065966 A1 | 4/2003 | Poisner | |
| 2003/0081389 A1 * | 5/2003 | Nair et al. | 361/764 |
| 2003/0126477 A1 * | 7/2003 | Zhang et al. | 713/300 |
| 2004/0142603 A1 | 7/2004 | Walker | |
| 2005/0127758 A1 | 6/2005 | Atkinson et al. | |
| 2005/0207133 A1 | 9/2005 | Pavier et al. | |
| 2006/0041763 A1 | 2/2006 | Borkar et al. | |
| 2006/0065962 A1 | 3/2006 | Narendra et al. | |

FOREIGN PATENT DOCUMENTS

GB 2399684 9/2004
WO WO 03/073250 9/2003

OTHER PUBLICATIONS

PCT Search Report, PCT/US2005/035475, mailed Feb. 8, 2006.
Andrew Mason et al. "A Low-Power Wireless Microinstrumentation System for Environmental Monitoring", IEEE Transducers-Eurosensors IX, 8th Intl. Conference on Solid State Sensors & Actuators. Jun. 25-29, 1995, pp. 107-110.
Tschanz., James W. et al. "Adaptive Body Bias for Reducing Impacts of Die-to-Die and Within-Die Parameter Variations on Microprocessor Frequency and Leakage", IEEE Journal of Solid-State Circuits, vol. 37, No. 11. Nov. 2002.

* cited by examiner

*Primary Examiner*—Tse Chen
(74) *Attorney, Agent, or Firm*—Blakely, Sokoloff, Taylor & Zafman LLP

(57) ABSTRACT

A central processing unit (CPU) is disclosed. The CPU includes a CPU die; and a voltage regulator die bonded to the CPU die in a three dimensional packaging layout.

11 Claims, 4 Drawing Sheets

CPU POWER DELIVERY SYSTEM

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to computer systems; more particularly, the present invention relates to delivering power to a central processing unit (CPU).

BACKGROUND

Integrated circuit components, such as central processing units (CPUs), are typically powered by a voltage regulator module (VRM) located at a remote location, such as on the CPU motherboard. The motherboard voltage regulator module (VRM) typically supplies a single supply voltage (Vcc) to multiple CPU cores, a cache and input/output (I/O) components. This is due to the fact that power delivery systems do not have sufficient area on the board, socket and package to route separate supply voltages to multiple cores, cache and I/O components.

BRIEF DESCRIPTION OF THE DRAWINGS

The invention is illustrated by way of example and not limitation in the figures of the accompanying drawings, in which like references indicate similar elements, and in which.

DETAILED DESCRIPTION

According to one embodiment, a power delivery system for a CPU is described. In the following detailed description of the present invention, numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
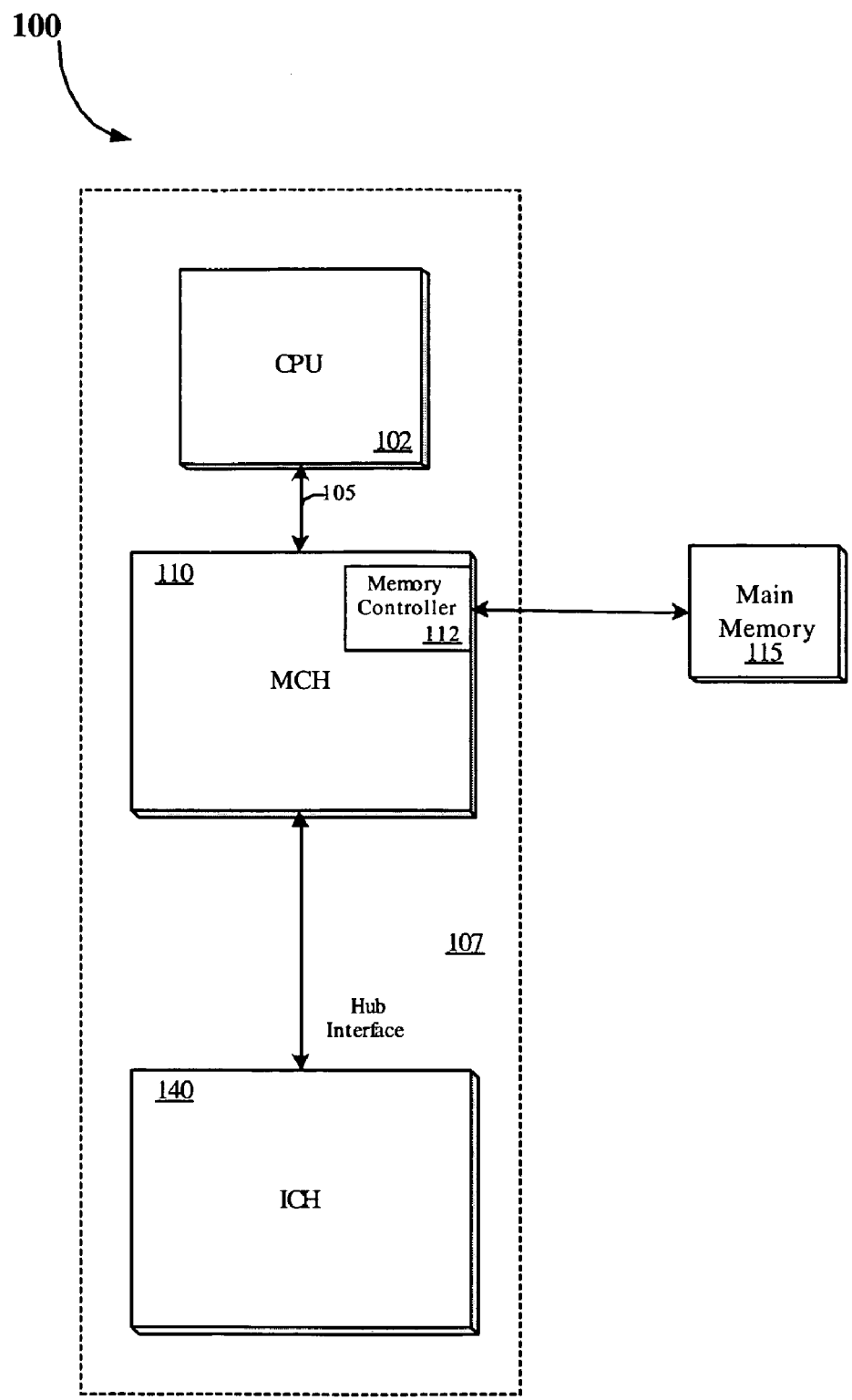
FIG. 1 is a block diagram of one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions that are executed by CPU 102 or any other device included in system 100. In one embodiment, main system memory 115 includes dynamic random access memory (DRAM); however, main system memory 115 may be implemented using other memory types. Additional devices may also be coupled to bus 105, such as multiple CPUs and/or multiple system memories.

Chipset 107 also includes an input/output control hub (ICH) 140 coupled to MCH 110 to via a hub interface. ICH 140 provides an interface to input/output (I/O) devices within computer system 100. For instance, ICH 140 may be coupled to a Peripheral Component Interconnect bus adhering to a Specification Revision 2.1 bus developed by the PCI Special Interest Group of Portland, Oreg.

Figure 2:
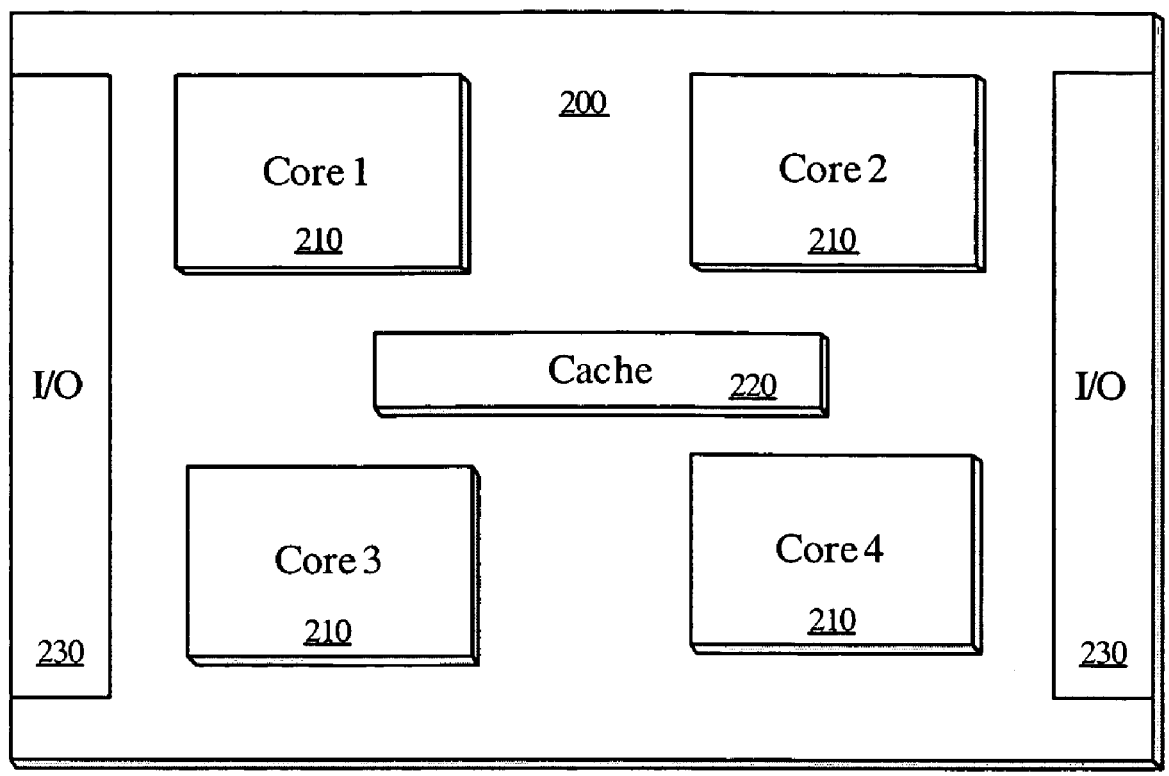
FIG. 2 illustrates one embodiment of a CPU die.

FIG. 2 illustrates one embodiment of a CPU 102 die 200. Die 200 includes four CPU processing cores (core 1-core 4) 210. In addition, die 200 includes cache 220 and I/O circuitry 230. In one embodiment, cache 220 is a L2/L3 cache. I/O circuitry 230 is placed on the periphery (e.g., north, south, east, and west boundaries) to enable efficient vertical current delivery to cores 210.

As discussed above, a motherboard voltage regulator module typically supplies a single Vcc to the cores, cache and I/O circuitry since power delivery systems do not have sufficient area on the board, socket and package to route separate supply voltages to multiple cores, cache and I/O components.

Various architectural studies have shown that there is a tremendous power saving if all cores are not active and performing at the same Vcc at the same time. Thus, variable core-level Vcc provides significant power saving. Moreover, components within a single core, can be shut down or put on lower Vcc to save active power. For example, a core may include performance-critical and non-critical components. The core would operate more efficiently if the non-critical component could be supplied by a separate, lower Vcc to save active and leakage power. However, as discussed above, an external VRM on a motherboard is insufficient to enable a multi-Vcc solution.

Figure 3:
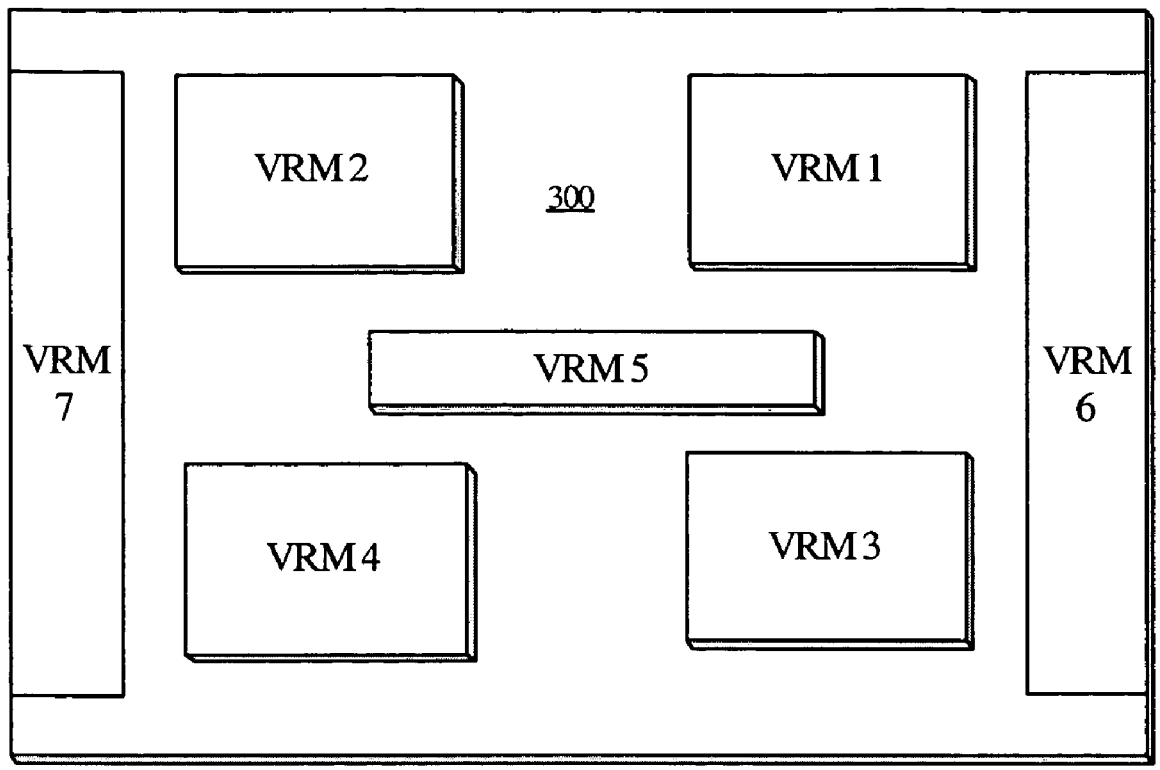
FIG. 3 illustrates one embodiment of a voltage regulator die.

According to one embodiment, a multiple Vcc VRM die is bonded to CPU die 200. FIG. 3 illustrates one embodiment of a VRM die 300. In one embodiment, VRM die 300 includes seven VRMs (VRM 1-VRM 7) that provide a regulated voltage supply to each component within CPU die 200. For instance VRM 1-VRM 4 supply a Vcc voltages to Core 1-Core 4, respectively.

In addition, VRM 5 supplies a Vcc to cache 220, while VRM 6 and VRM 7 provide voltages to I/O circuitry 230, respectively. Note that in other embodiments, other quantities of VRMs may be included in die 300, depending on the number of components within die 200 that are to have separate voltage supplies. Also, the voltages supplied by each VRM may be the same or different from voltages supplied by the other VRMs.

According to one embodiment, die 300 is flipped and bonded (metal-side to metal-side) to supply appropriate cores, thus bringing the VRMs as close to the CPU die 200 as possible. In a further embodiment, VRM die 300 is in a three dimensional (3D) packaging configuration with die 200.

Figure 4:
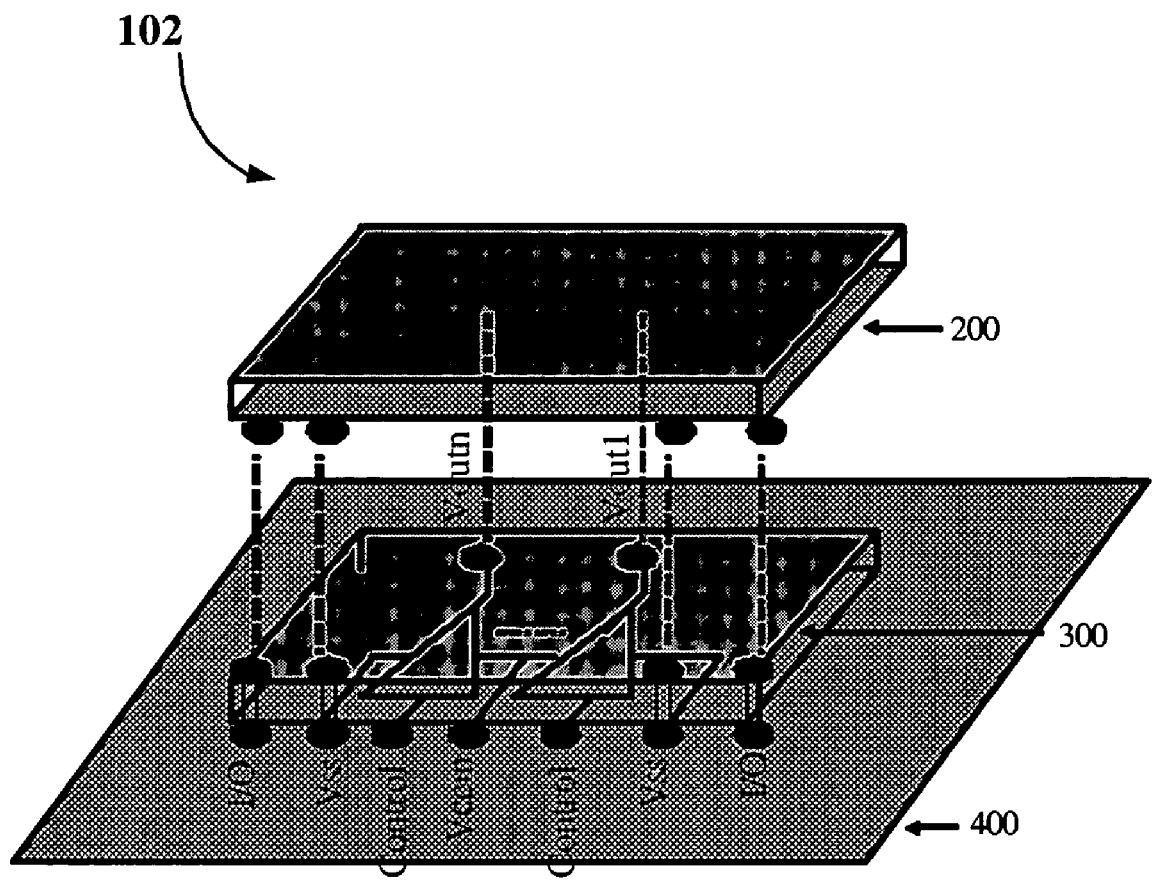
FIG. 4 illustrates one embodiment of a CPU.

FIG. 4 illustrates one embodiment of CPU 102. CPU 102 includes the multi-Vcc VRM die 300 sandwiched between CPU die 200 and a package substrate 400. According to one embodiment, VRM die 300 is pad matched to CPU die 200 and package substrate 400 so that die 300 can be an option sandwiched die. Thus, package 400 and CPU 200 design does not need any changes.

In addition, FIG. 4 shows the I/O connections between die 200 and 300, as well as the die/die bonding. Note that only two regulators are shown on die 200 for simplicity. Further, a heat spreader and heat sink (not shown) may be coupled to CPU die 200.

The above-described integrated 3D VRM avoids the discontinuities and impedances in the VRM to die power delivery path, which give rise to amplitude/phase degradation and response time delay.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. A central processing unit (CPU) comprising:
   a CPU die, including;
      a first processing core;
      a second processing core; and
   a voltage regulator die having a metal side surface bonded to a metal side surface of the CPU die in a three dimensional packaging configuration, including:
      a first voltage regulator module (VRM) to supply a first voltage to the first processing core; and
      a second VRM to supply a second voltage to the second processing core.

2. The CPU of claim 1 wherein the first voltage is equal to the second voltage.

3. The CPU of claim 1 wherein the voltage regulator die further comprises:
   a third VRM to supply a third voltage to a cache at the CPU die; and
   a fourth VRM to supply a fourth voltage to an input/output (I/O) circuitry at the CPU die.

4. The CPU of claim 3 further comprising I/O connections coupled between the voltage regulator die and the CPU die.

5. The CPU of claim 1 further comprising a package substrate bonded to the voltage regulator die.

6. The CPU of claim 5 wherein the voltage regulator die is pad matched to the CPU die and the package substrate.

7. The CPU of claim 1 wherein the voltage regulator die is flipped and bonded to the CPU die metal side to metal side.

8. A system comprising:
   a central processing unit (CPU) having:
      a CPU die, including;
         a first processing core;
         a second processing core; and
      a voltage regulator die having a metal side surface bonded to a metal side surface of the CPU die in a three dimensional packaging configuration, including:
         a first voltage regulator module (VRM) to supply a first voltage to the first processing core;
         a second VRM to supply a second voltage to the second processing core;
   a chipset coupled to the CPU; and
   a main memory device coupled to the chipset.

9. The system of claim 8 wherein the voltage regulator die further comprises:
   a third VRM to supply a third voltage to a cache at the CPU die; and
   a fourth VRM to supply a fourth voltage to an input/output (I/O) circuitry at the CPU die.

10. The system of claim 9 further comprising I/O connections coupled between the voltage regulator die and the CPU die.

11. The system of claim 8 wherein the CPU further comprises a package substrate bonded to the voltage regulator die.

* * * * *